(12) United States Patent
Parkhurst et al.

(10) Patent No.: US 10,979,006 B2
(45) Date of Patent: Apr. 13, 2021

(54) CHOPPER-STABILIZED CURRENT FEEDBACK AMPLIFIER

(71) Applicant: Texas Instruments Incorporated, Dallas, TX (US)

(72) Inventors: Charles Parkhurst, Murphy, TX (US); Julio E. Acosta, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 87 days.

(21) Appl. No.: 16/437,441

(22) Filed: Jun. 11, 2019

(65) Prior Publication Data
US 2020/0395899 A1    Dec. 17, 2020

(51) Int. Cl.
*H03F 1/02*     (2006.01)
*H03F 3/16*     (2006.01)
*H03K 19/20*    (2006.01)

(52) U.S. Cl.
CPC ............... *H03F 3/16* (2013.01); *H03K 19/20* (2013.01); *H03F 2200/129* (2013.01); *H03F 2200/168* (2013.01)

(58) Field of Classification Search
CPC ............... H03F 1/02; H03F 3/005; H03F 3/45
USPC ...................................... 330/9, 288; 327/124
See application file for complete search history.

(56) References Cited

U.S. PATENT DOCUMENTS

2014/0340145 A1* 11/2014 Funato .................. H03M 1/645
330/9

* cited by examiner

*Primary Examiner* — Steven J Mottola
(74) *Attorney, Agent, or Firm* — John R. Pessetto; Charles A. Brill; Frank D. Cimino

(57) ABSTRACT

A chopper-stabilized current feedback amplifier includes an input buffer having a non-inverting input and an inverting input. A first group of chopper circuits modulate current at the non-inverting and inverting inputs. The current feedback amplifier further includes a plurality of current mirrors coupled to the input buffer. A second group of chopper circuits modulate current in the current mirrors. The current feedback amplifier also includes phase detector circuitry coupled to the current mirrors and configured to detect a transition current in the current mirrors. The current feedback amplifier also includes a switched capacitor filter having an input coupled to the current mirrors. The switched capacitor filter is turned OFF responsive to the detection of the transition current by the phase detector circuitry. The current feedback amplifier also includes an output stage having an input coupled to the switched capacitor filter and is configured to produce an output signal.

18 Claims, 3 Drawing Sheets

CHOPPER-STABILIZED CURRENT FEEDBACK AMPLIFIER

BACKGROUND

The invention relates generally to current feedback amplifiers, and more particularly to chopper-stabilized current feedback amplifiers.

DESCRIPTION OF THE RELATED ART

Current feedback amplifiers are used in video drivers, equalizing filters, input drivers and communication devices. A current feedback amplifier has a high impedance non-inverting input and a low impedance inverting input. In response to an error current at one of its inputs, the current feedback amplifier produces a corresponding output voltage. The current feedback amplifier provides a fast transient response and has a bandwidth that is relatively independent of closed loop gain. However, DC accuracy of the current feedback amplifier is poor due to higher input bias current and higher offset voltage. Accordingly, improvement in current feedback amplifiers is desired.

SUMMARY

Various aspects of the present disclosure are directed to a chopper-stabilized current feedback amplifier. In one aspect of the present disclosure, a current feedback amplifier includes an input buffer having a non-inverting input and an inverting input. A first group of chopper circuits is configured to modulate current at the non-inverting and inverting inputs. The current feedback amplifier further includes a plurality of upper current mirrors coupled between a voltage supply and the input buffer. A second group of chopper circuits is configured to modulate current through the upper current mirrors. The current feedback amplifier also includes a plurality of lower current mirrors coupled between the input buffer and ground. A third group chopper circuits is configured to modulate current through the lower current mirrors. The current feedback amplifier also includes a first and a second phase detector circuit configured to conduct current responsive to a transition current through at least one of the upper and the lower current mirrors. The current feedback amplifier also includes a logic circuit having inputs coupled to the first and second phase detector circuits. The logic circuit is operable to output a logic ONE (1) if at least one of the first and second phase detectors conduct current and is operable to output a logic ZERO (0) if neither the first nor the second phase detector conducts current. The current feedback amplifier also includes a switched capacitor filter having an input coupled to an output of the upper and lower current mirrors and having an input coupled to an output of the logic circuit. The switched capacitor filter is configured to turn OFF responsive to the logic ONE (1) and to turn ON responsive to the logic ZERO (0). The switched capacitor filter produces a first filtered signal. The current feedback amplifier also includes an output stage having an input coupled to receive the first filtered signal and configured to produce an output signal for the current feedback amplifier.

In an additional aspect of the present disclosure, a current feedback amplifier includes a plurality of upper current mirrors coupled between a voltage supply and an upper cascode circuit. A first group of chopper circuits is configured to modulate current through the upper current mirrors and the upper cascode circuit. The current feedback amplifier further includes a plurality of lower current mirrors coupled between a lower cascode circuit and ground. A second group chopper circuits is configured to modulate current through the lower current mirrors and the lower cascode circuit. The current feedback amplifier also includes an input buffer having a non-inverting input and an inverting input and coupled between the upper and lower cascode circuits. A third group of chopper circuits is configured to modulate current at the non-inverting and inverting inputs. The current feedback amplifier also includes a first and a second phase detector circuit configured to conduct current responsive to a transition current through at least one of the upper and the lower current mirrors. The current feedback amplifier also includes a logic circuit having inputs coupled to the first and second phase detector circuits. The logic circuit is operable to output a logic ONE (1) if at least one of the first and second phase detectors conduct current and is operable to output a logic ZERO (0) if neither the first nor the second phase detector conducts current. The current feedback amplifier also includes a switched capacitor filter having an input coupled to an output of the upper and lower current mirrors and having an input coupled to an output of the logic circuit. The switched capacitor filter is configured to turn OFF responsive to the logic ONE (1) and to turn ON responsive to the logic ZERO (0). The switched capacitor filter produces a first filtered signal. The current feedback amplifier also includes an output stage having an input coupled to receive the first filtered signal and configured to produce an output signal for the current feedback amplifier.

In an additional aspect of the disclosure, a current feedback amplifier includes an input buffer having a non-inverting input and an inverting input. A first group of chopper circuits is configured to modulate current at the non-inverting and inverting inputs. The current feedback amplifier further includes a plurality of current mirrors coupled to the input buffer. A second group of chopper circuits is configured to modulate current through the current mirrors. The current feedback amplifier also includes phase detector circuitry coupled to the current mirrors and configured to detect a transition current through the current mirrors. The current feedback amplifier also includes a switched capacitor filter having an input coupled to an output of the current mirrors. The switched capacitor filter is turned OFF responsive to the detection of the transition current by the phase detector circuitry. The switched capacitor filter is configured to produce a first filtered signal. The current feedback amplifier also includes an output stage having an input coupled to receive the first filtered signal and configured to produce an output signal for the current feedback amplifier.

DETAILED DESCRIPTION

Various embodiments of the disclosure may be described herein in terms of devices and functional components. The functional components may be realized by any number of hardware or structural components configured to perform specific functions. For example, the embodiments may employ integrated components, such as buffers, current mirrors, choppers, phase detectors, and logic devices comprised of transistors, resistors, capacitors, diodes and the like, whose values may be suitably configured for various intended purposes. The exemplary embodiments may be practiced in any integrated circuit application. For purposes of illustration only, exemplary embodiments may be described herein in connection with a current feedback amplifier within an integrated circuit.

Figure 1:
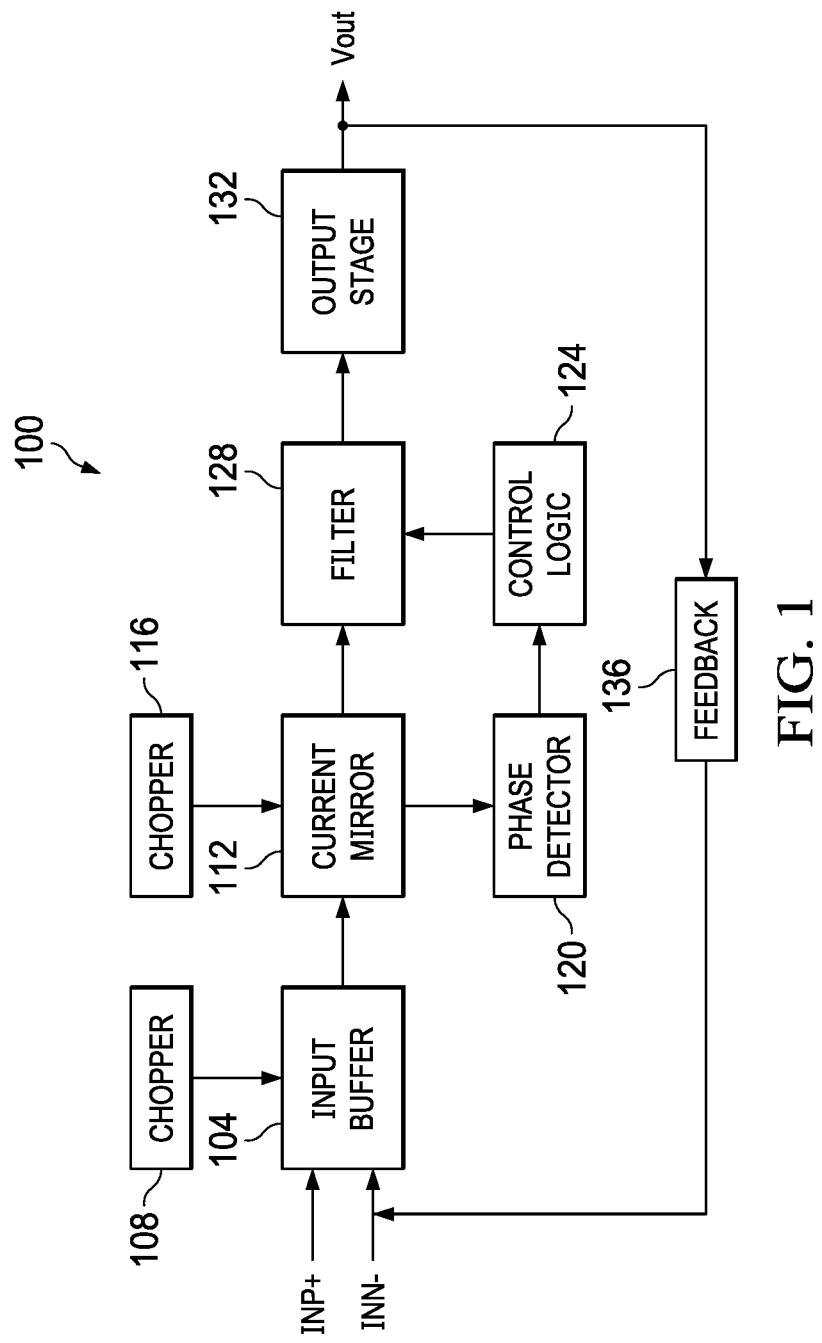
FIG. 1 illustrates a functional block diagram of a current feedback amplifier in accordance with disclosed embodiments.

FIG. 1 illustrates a functional block diagram of a current feedback amplifier 100 in accordance with disclosed embodiments. The current feedback amplifier 100 generally includes an input buffer 104 providing a non-inverting input INP and an inverting input INN. Chopper circuitry 108 coupled to the input buffer 104 modulates current to lower offset voltages at the input terminals.

Referring to FIG. 1, the current feedback amplifier 100 includes mirror circuitry 112 configured to mirror current from the input buffer 104. Chopper circuitry 116 coupled to the mirror circuitry 112 modulates current in the mirror circuitry 112. A filter 128 is added to the signal path to filter ripple noise due to the chopping action of the chopper circuitry. The filter 128 may comprise a switched capacitor type filter.

The current feedback amplifier 100 includes phase detector circuitry 120 configured to detect transition currents in the mirror circuitry 112. Responsive to a detection of the transition currents by the phase detector circuitry 120, a logic circuit 124 turns OFF the filter 128 by closing a plurality of switches in the filter 128. If the phase detector circuitry 120 does not detect transition currents in the mirror circuitry 112, the switches are operated (i.e., switched) at a suitable frequency. The current feedback amplifier 100 includes an output stage 132 having an input coupled to receive a filtered signal from the filter 128 and to provide an output signal Vout for the current feedback amplifier 100. A feedback resistor 136 is coupled between the output and the inverting input INN to provide a feedback loop.

Figure 2:
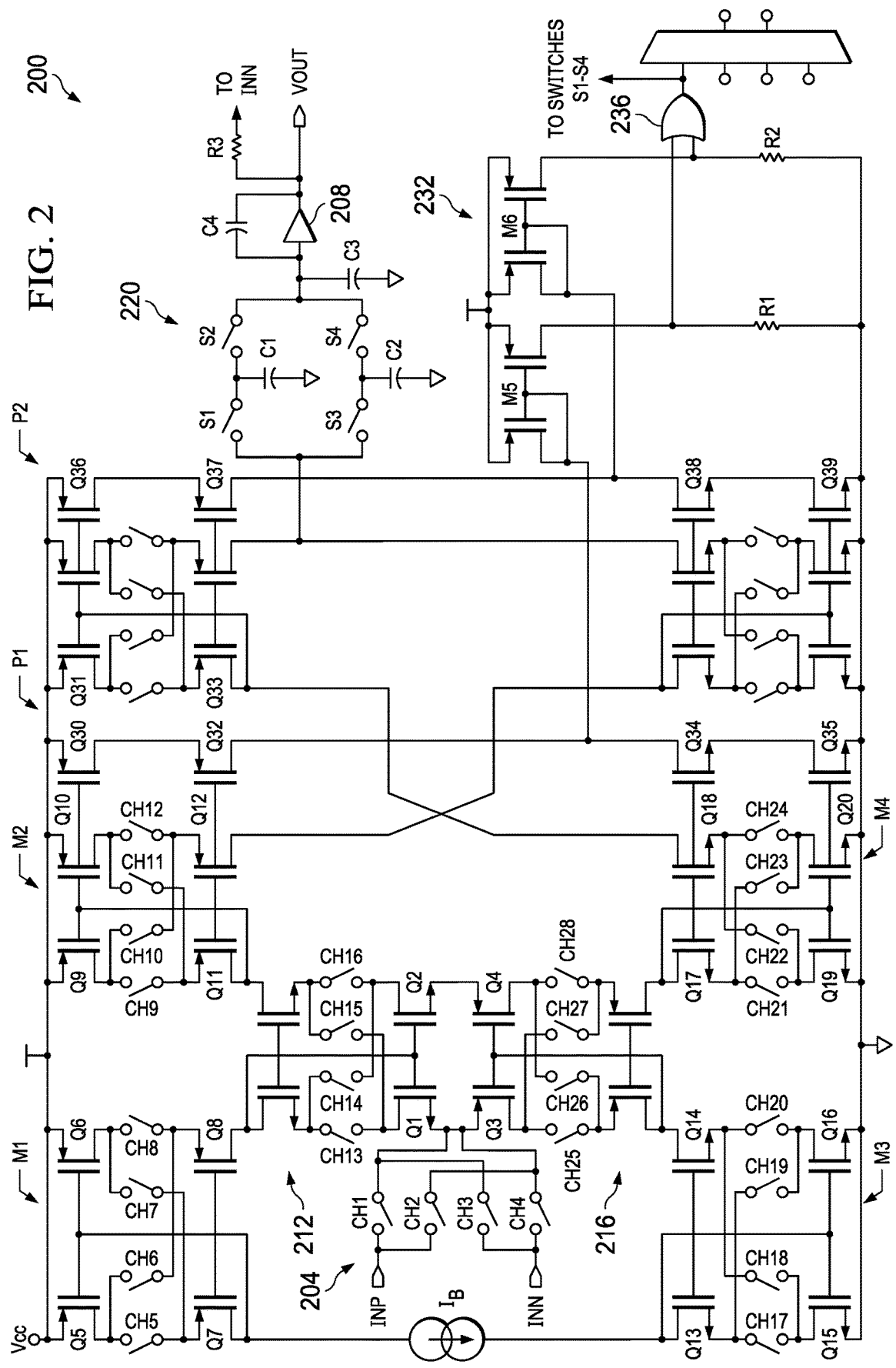
FIG. 2 illustrates a current feedback amplifier in accordance with disclosed embodiments.

FIG. 2 illustrates a current feedback amplifier 200 in accordance with disclosed embodiments. The current feedback amplifier 200 generally includes an input buffer 204, upper current mirrors M1, M2, lower current mirrors M3, M4, first and second phase detectors P1, P2, and an output stage 208.

Again, with reference to FIG. 2, the input buffer 204 comprises a pair of NMOS transistors Q1 and Q2 and a pair of PMOS transistors Q3 and Q4 connected in a configuration which provides a non-inverting input INP and an inverting input INN. Chopper circuits CH1-CH4 modulate current through the non-inverting input INP and the inverting input INN to lower offset voltage at the input terminals. The NMOS transistors Q1 and Q2 and the PMOS transistors Q3 and Q4 drive the upper and lower current mirrors M1, M2 and M3, M4, which provide mirrored current to the output stage 208.

The upper current mirrors M1, M2 are coupled between a DC voltage supply Vcc and an upper cascode 212. The upper current mirror M1 comprises PMOS transistors Q5-Q8 and and the upper current mirror M2 comprises PMOS transistors Q9-Q12.

Chopper circuits CH5-CH8 modulate current through the upper current mirror M1 and chopper circuits CH9-CH12 modulate current through the upper current mirror M2. Chopper circuits CH13-CH16 modulate current through the upper cascode 212.

The lower current mirrors M3, M4 are coupled between ground and a lower cascode 216. The lower current mirror M3 comprises NMOS transistors Q13-Q16, and the lower current mirror M4 comprises NMOS transistors Q17-Q20. Chopper circuits CH17-CH24 modulate current through the lower current mirrors M3, M4. Chopper circuits CH25-CH28 modulate current through the lower cascode 216. The input buffer 204 is coupled between the upper and lower cascodes 212, 216. The upper and lower cascodes 212, 216 reduce channel errors in the input buffer 204, thereby increasing accurcy of the upper and lower current mirrors M1, M2, and M3, M4.

The upper and lower current mirrors M1, M2, and M3, M4 can comprise any configuration for mirroring current from the input buffer 204 to the output stage 208. The output stage 208 may comprise any output buffer configuration for providing an output signal for the current feedback amplifier 200.

Referring to FIG. 2, the noninverting input INP is the high-impedance input of the input buffer 204, and the inverting input INN is its low-impedance output. The input buffer 204 allows an error current to flow in or out of the inverting input INN, and the unity gain forces the inverting input INN to track the noninverting input INP. The error current is mirrored to a high impedance node, where it is converted to a voltage and buffered at the output.

Due to mismatches in the NMOS and PMOS devices in the gain stage of the current feedback amplifier 200, an offset voltage is formed at the input buffer 204. The offset voltage is amplified by the gain stage of the current feedback amplifier 200. In order to reduce the offset voltage, the chopper circuits independently modulate current through the transistors. However, due to chopping by the chopper circuits, ripple noise is generated which is filtered by a switched capacitor filter 220 (also referred to as a ripple filter) in the signal path prior to the output stage 208. The switched capacitor filter 220 produces a filtered signal which is applied to an input of the output stage 208. The switched capacitor filter 220 comprises switches S1, S2, S3 and S4 and capacitors C1, C2 and C3.

Although the switched capacitor filter 220 is effective in reducing ripple noise created by the choppers, the switches S1, S2, S3, and S4 and the capacitors C1, C2 and C3 function as an R-C equivalent filter defined by the switching frequency. As a result, the filter 220 degrades the slew rate of the current feedback amplifier 200 by adding latency to the signal path. The effect of this is that HIGH to LOW and LOW to HIGH transition response of the current feedback amplifier 200 is degraded.

To address the slew rate degradation caused by the filter 220, first and second phase detectors P1 and P2 are provided within the signal path. The first phase detector P1 comprises PMOS transistors Q30, Q32 and NMOS transistors Q34, Q35. The second phase detector P2 comprises PMOS transistors Q36, Q37 and NMOS transistors Q38, Q39. The first and second phase detectors P1, P2 detect transition currents in the upper and lower current mirrors M1, M2, M3 and M4. In response to current transitioning from HIGH to LOW or LOW to HIGH in the current mirrors, at least one of the first and the second phase detectors P1, P2 conduct current.

The first and second phase detectors P1, P2 can comprise any configuration for detecting transition currents in the current mirrors M1, M2, M3 and M4. By way of example, the first and second phase detectors P1, P2 may be configured as phase comparators that generate an output signal representing the difference in phase between an input signal and a reference signal.

The current feedback amplifier 200 includes a logic circuit 232 coupled to the first and second phase detectors P1, P2. The logic circuit 232 comprises a current mirror M5 to mirror current from the first phase detector P1, and comprises a current mirror M6 to mirror current from the second phase detector P2. Resistors R1 and R2 are coupled to respective current mirrors M5 and M6 and ground. Responsive to current flowing in the current mirrors M5 and/or M6, voltages appear across the resistors R1 and/or R2.

The logic circuit 232 includes a logical OR gate 236 having inputs coupled to the current mirrors M5, M6 and the resistors R1, R2. Responsive to a voltage across the resistors R1 and/or R2, the OR gate 236 outputs a logic ONE (1). If no current flows through R1 and R2, the OR gate 236 outputs a logic ZERO (0). Thus, the logic circuit 232 outputs a logic ONE (1) if the phase detector P1 and/or the phase detector P2 detects a transition current in any one of the current mirrors M1, M2, M3 and M4, and outputs a logic ZERO (0) if the phase detectors P1, P2 do not detect a transition current in any one of the current mirrors.

According to disclosed embodiments, the operation of the filter 220 is controlled by the logic circuit 232. If the logic circuit 232 outputs a logic ONE (1) responsive to a detection of transition current in at least one of the current mirrors M1, M2, M3 and M4, the switches S1, S2, S3 and S4 are closed which turns OFF the switched capacitor filter. If the logic circuit 232 outputs a logic ZERO (0) responsive to a lack of detection of transition current in any one of the current mirrors M1, M2, M3 and M4, the switches S1, S2, S3 and S4 are operated (i.e., switched) at a suitable frequency. Thus, the filter 220 ceases to operate as a switched capacitor filter when there is a transition current through any one of the current mirrors M1, M2, M3 and M4, and operates as a switched capacitor filter only during a time period when there is no transition current. The effect of this is that the slew rate of the current feedback amplifier 200 is improved.

The output stage 208 has an input coupled to receive the filtered signal from the filter 220. A capacitor C4 is coupled between an output and the input of the output stage 208. A feedback resistor R3 is coupled between the output and the inverting input INN of the current feedback amplifier 200. The feedback resistor R3 forms a feedback loop and determines the overall gain of the current feedback amplifier 200. The output stage 208 is configured to provide an output signal Vout for the current feedback amplifier 200.

According to disclosed embodiments, a biasing current source Ib is coupled between the drain of PMOS transistor Q7 and the drain of NMOS transistor Q13. The biasing current source Ib compensates for any current flowing through the inverting input INN of the input buffer 204 due to mismatches in the NMOS and PMOS transistors in the current feedback amplifier 200.

Figure 3:
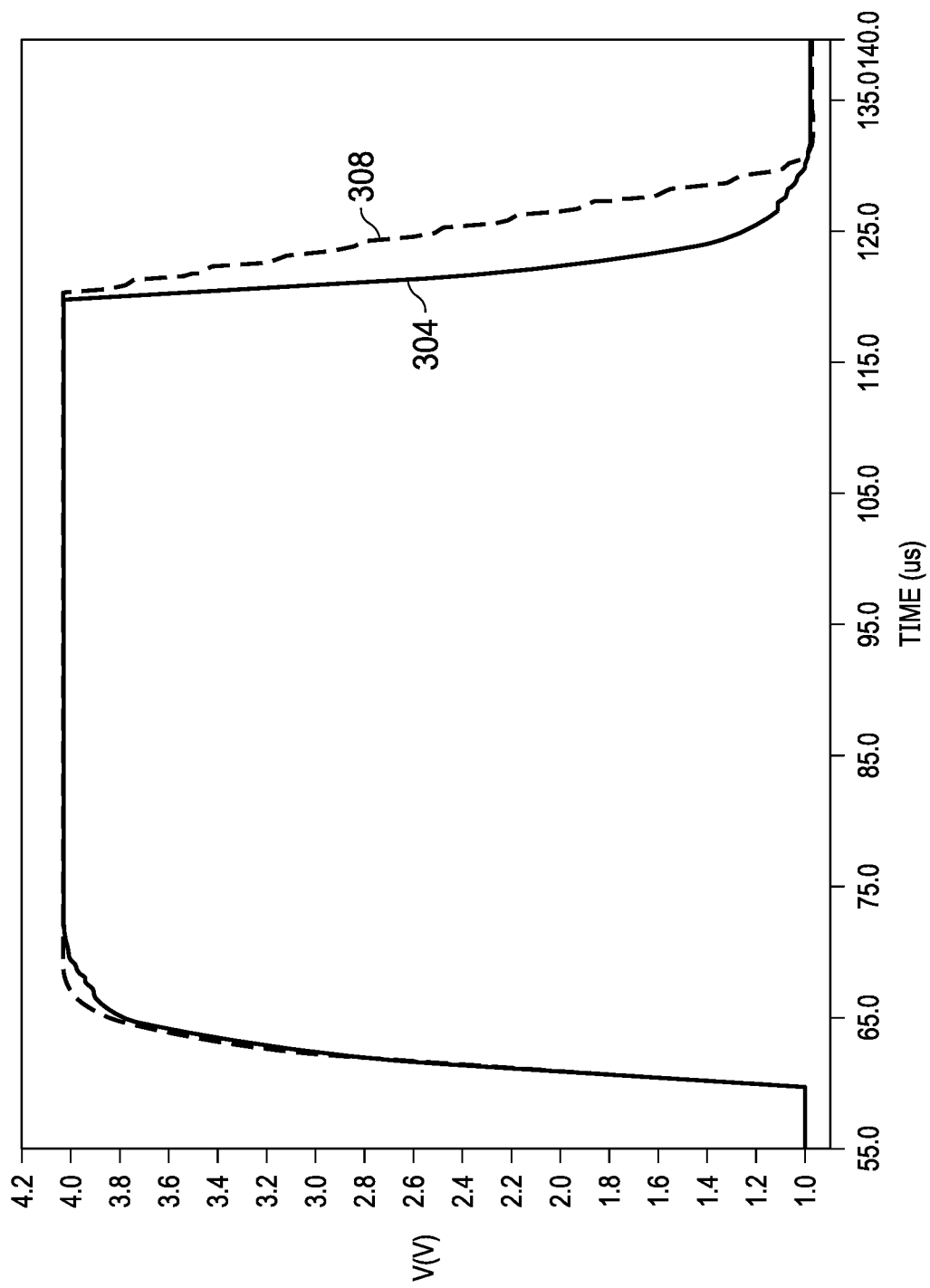
FIG. 3 shows an output waveform of the current feedback amplifier of FIG. 2.

FIG. 3 shows an output waveform 304 of the current feedback amplifier 200 and an output waveform 308 of a current feedback amplifier without chopper stabilization. In a HIGH to LOW transition, the slew rate of the waveform 304 is greater than the slew rate of the waveform 308. Thus, the current feedback amplifier 200 demonstrates improved slew rate responsive to a square wave input.

Variations to the current feedback amplifier 200 are possible within the scope of the disclosure. For example, the current feedback amplifier 200 could be modified so that the cascodes 212, 216 are not included. Thus, in some variations within the scope of the disclosure, the input buffer 204 may be directly coupled to the current mirrors M1, M2, M3 and M4.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A current feedback amplifier comprising:
   an input buffer having a non-inverting input and an inverting input, the non-inverting and inverting inputs having a first group of chopper circuits configured to modulate current at the non-inverting and inverting inputs;
   a plurality of upper current mirrors coupled between a voltage supply and the input buffer, the upper current mirrors having a second group of chopper circuits configured to modulate current in the upper current mirrors;
   a plurality of lower current mirrors coupled between the input buffer and ground, the lower current mirrors having a third group chopper circuits configured to modulate current in the lower current mirrors;
   a first and a second phase detector circuit configured to conduct current responsive to a transition current in at least one of the upper and the lower current mirrors;
   a logic circuit having inputs coupled to the first and second phase detector circuits and operable to output a logic ONE (1) if at least one of the first and second phase detectors conduct current and operable to output a logic ZERO (0) if neither the first nor the second phase detector conducts current;
   a switched capacitor filter having an input coupled to an output of the upper and lower current mirrors and having an input coupled to an output of the logic circuit, the switched capacitor filter configured to turn OFF responsive to the logic ONE (1) and to turn ON responsive to the logic ZERO (0), the switched capacitor filter configured to produce a first filtered signal; and
   an output stage having an input coupled to receive the first filtered signal and configured to produce an output signal for the current feedback amplifier.

2. The current feedback amplifier of claim 1, wherein the switched capacitor filter comprises a plurality of switches, and wherein the switches are closed responsive to the logic ONE (1).

3. The current feedback amplifier of claim 1 further comprising a feedback resistor coupled between the output of the current feedback amplifier and the inverting input.

4. The current feedback amplifier of claim 1 further comprising a bias current source coupled between the upper and the lower current mirrors.

5. The current feedback amplifier of claim 1 wherein the input buffer comprises first and second NMOS transistors and first and second PMOS transistors, wherein the input buffer is configured to drive the upper and lower current mirrors.

6. The current feedback amplifier of claim 1, wherein the upper current mirrors comprise a plurality of PMOS transistors and wherein the lower current mirrors comprise a plurality of NMOS transistors, and wherein the upper and lower current mirrors are configured to mirror current from the input buffer to the output stage.

7. The current feedback amplifier of claim 1, wherein the logic circuit further comprises:
a first current mirror configured to mirror current from the first phase detector;
a second current mirror configured to mirror current from the second phase detector; and
an OR gate having inputs coupled to the first and second current mirrors, wherein the OR gate outputs the logic ONE (1) responsive to a current in at least one of the first and second current mirrors and outputs the logic ZERO (0) in absence of a current in the first and the second current mirrors.

8. The current feedback amplifier of claim 1 further comprising a capacitor coupled between the output and the input of the output stage.

9. A current feedback amplifier comprising:
a plurality of upper current mirrors coupled between a voltage supply and an upper cascode circuit, the upper current mirrors and the upper cascode circuit having a first group of chopper circuits configured to modulate current through the upper current mirrors and the upper cascode circuit;
a plurality of lower current mirrors coupled between a lower cascode circuit and ground, the lower current mirrors and the lower cascode circuit having a second group chopper circuits configured to modulate current in the lower current mirrors and the lower cascode circuit;
an input buffer having a non-inverting input and an inverting input and coupled between the upper and lower cascode circuits, the non-inverting and inverting inputs having a third group of chopper circuits configured to modulate current at the non-inverting and inverting inputs;
a first and a second phase detector circuit configured to conduct current responsive to a transition current in at least one of the upper and the lower current mirrors;
a logic circuit having inputs coupled to the first and second phase detector circuits and operable to output a logic ONE (1) if at least one of the first and second phase detectors conduct current and operable to output a logic ZERO (0) if neither the first nor second phase detector conducts current;
a switched capacitor filter having an input coupled to an output of the upper and lower current mirrors and having an input coupled to an output of the logic circuit, the switched capacitor filter configured to turn OFF responsive to the logic ONE (1) and to turn ON responsive to the logic ZERO (0), the switched capacitor filter configured to produce a first filtered signal; and
an output stage having an input coupled to receive the first filtered signal and configured to produce an output signal for the current feedback amplifier.

10. The current feedback amplifier of claim 9, wherein the switched capacitor filter comprises a plurality of switches, and wherein the switches are closed responsive to the logic ONE (1).

11. The current feedback amplifier of claim 9 further comprising a feedback resistor coupled between the output of the current feedback amplifier and the inverting input.

12. The current feedback amplifier of claim 9 further comprising a bias current source coupled between the upper and the lower current mirrors.

13. The current feedback amplifier of claim 9 wherein the input buffer comprises first and second NMOS transistors and first and second PMOS transistors, wherein the input buffer is configured to drive the upper and lower current mirrors.

14. The current feedback amplifier of claim 9, wherein the upper current mirrors comprise a plurality of PMOS transistors and wherein the lower current mirrors comprise a plurality of NMOS transistors, and wherein the upper and lower current mirrors are configured to mirror current from the input buffer to the output stage.

15. The current feedback amplifier of claim 9, wherein the logic circuit further comprises:
a first current mirror configured to mirror current from the first phase detector;
a second current mirror configured to mirror current from the second phase detector; and
an OR gate having inputs coupled to the first and second current mirrors, wherein the OR gate outputs a logic ONE (1) responsive to a current in at least one of the first and second current mirrors and outputs a logic ZERO (0) in the absence of a current in the first and the second current mirrors.

16. A current feedback amplifier comprising:
an input buffer having a non-inverting input and an inverting input, the non-inverting and inverting inputs having a first group of chopper circuits configured to modulate current at the non-inverting and inverting inputs;
a plurality of current mirrors coupled to the input buffer, the current mirrors having a second group of chopper circuits configured to modulate current in the current mirrors;
phase detector circuitry coupled to the current mirrors and configured to detect a transition current in the current mirrors;
a switched capacitor filter having an input coupled to an output of the current mirrors, wherein the switched capacitor filter is turned OFF responsive to the detection of the transition current by the phase detector circuitry, the switched capacitor filter configured to produce a first filtered signal; and
an output stage having an input coupled to receive the first filtered signal and configured to produce an output signal for the current feedback amplifier.

17. The current feedback amplifier of claim 16 further comprising a logic circuit having inputs coupled to the phase detector circuitry and operable to output a logic ONE (1) responsive to the detection of the transition current by the phase detector circuitry and operable to output a logic ZERO (0) in the absence of detection of the transition current by the phase detector circuitry.

18. The current feedback amplifier of claim 16 further comprising a feedback resistor coupled between the output of the current feedback amplifier and the inverting input.

* * * * *